(12) United States Patent
Baumgartner et al.

(10) Patent No.: US 7,913,208 B2
(45) Date of Patent: Mar. 22, 2011

(54) OPTIMAL SIMPLIFICATION OF CONSTRAINT-BASED TESTBENCHES

(75) Inventors: Jason Baumgartner, Austin, TX (US); Robert Kanzelman, Rochester, MN (US); Hari Mony, Austin, TX (US); Viresh Paruthi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 683 days.

(21) Appl. No.: 11/870,471

(22) Filed: Oct. 11, 2007

(65) Prior Publication Data

US 2009/0100385 A1   Apr. 16, 2009

(51) Int. Cl.
*G06F 17/50*   (2006.01)
(52) U.S. Cl. ......... 716/106; 716/101; 716/104; 716/119
(58) Field of Classification Search .................. 716/101, 716/104, 106, 119
See application file for complete search history.

(56) References Cited

U.S. PATENT DOCUMENTS

| | | | |
|---|---|---|---|
| 4,960,724 A * | 10/1990 | Watanabe et al. ................. | 716/2 |
| 6,298,319 B1 | 10/2001 | Heile et al. | |
| 6,301,687 B1 * | 10/2001 | Jain et al. ........................... | 716/3 |
| 6,311,317 B1 | 10/2001 | Khoche et al. | |
| 6,678,644 B1 | 1/2004 | Segal | |
| 6,714,902 B1 | 3/2004 | Chao et al. | |
| 6,964,027 B2 | 11/2005 | Kucukcakar et al. | |
| 7,260,799 B2 | 8/2007 | Baumgartner et al. | |
| 2004/0153323 A1 | 8/2004 | Charney et al. | |
| 2007/0136701 A1 | 6/2007 | Baumgartner et al. | |

OTHER PUBLICATIONS

"Using Constraint Techniques for a Safe and Fast Implementation of Optimality-Based Reduction," by Yahia Lebbah et al., Symposium on Applied Computing, Mar. 11-15, 2007, Seoul, Korea.
"Testing Strategies for Simulation Optimization," by Russell R. Barton, Proceedings of 1987 Winter Simulation Conf.
"Verification Flow Optimization using an Automatic Coverage Driven Testing Policy," Younes Lahbib et al., IEEE Paper 0-7803-9727-4/06 (2006).
"Redundancy Removal and Test Generation for Circuits with Non-Boolean Primitives," IEEE Transaction on Computer-Aided Design of Integrated Circuits and Systems, by Srimat T. Chakradhar et al., vol. 16, No. 11, Nov. 1997.
"Circuit Partitioning with Logic Perturbation," by David Ihsin Cheng et al.; Report for NSF Grant MIP 9419119; Universithy of Electrical and Computer Engineering, UC Santa Barbara; available in ICCAD '95 Proceedings of the 1995 IEE/ACM Int'l Conf. on CAD, ISBN: 0-8186-7213-7; 1995.

* cited by examiner

*Primary Examiner* — Thuan Do
(74) *Attorney, Agent, or Firm* — The Brevetto Law Group; Scott Charles Richardson

(57) ABSTRACT

Methods and systems are provided for determining redundancies in a system model such as a complex circuit design including gates that are state components. A candidate redundant gate is selected, and a merged model is built that eliminates the candidate redundant gate. If the candidate redundant gate is within the merged constraint cone the pre-merge model is used to validate redundancy of the candidate redundant gate. However, if the candidate redundant gate is not within the merged constraint cone the merged model is instead used to validate redundancy of the candidate redundant gate.

12 Claims, 4 Drawing Sheets

OPTIMAL SIMPLIFICATION OF CONSTRAINT-BASED TESTBENCHES

BACKGROUND

1. Field

The present invention relates to modeling and testing digital designs of state machines, and more specifically, to systems, methods and computer products for the identification of dependent state variables to aid in logic design and verification.

2. Description of Related Art

A system such as an electrical circuit including state holding elements may be modeled using state equations and state variables that describe the behavior and state of the system. A complete set of state variables, coupled with logic that defines the transitions between states, for a system typically contains enough information about the system's history to enable computation of the system's future behavior. Simplifying the model to reduce the number of state variables, or simplifying the logic that defines state transitions, lessens the computational cost of analyzing the model for example, to verify that it conforms to a given specification.

Dependent state element identification refers to the process of identifying those state variables in a design (e.g. latches or registers) that can be expressed as combinational (Boolean) functions of other state variables. A special case of dependent state variables are redundant state variables, in which two registers evaluate to the same value at all points in time. For example, one register may be expressible as a function of other registries, e.g., register1 may be equal to the AND of register2 and register3 for all points in time. In such a situation, the register1 state variable is said to be redundant in view of register2 and register3. Redundancy removal—the process of merging two gates that always evaluate to identical values in all "reachable states" of a design—is a very powerful technique to enhance verification.

The computations needed to verify a system design tend to become very expensive as the model being analyzed increases in complexity. Verification paradigms typically suffer exponential runtime with respect to the number of state and logic elements of the design. By identifying behaviorally equivalent state and logic elements within a design, the size of the design may be reduced by eliminating those redundant elements for a particular application.

What is needed is an efficient way to optimally identify and leverage redundant logic elements to streamline the verification process. This disclosure introduces improved mechanisms for identifying redundant logic gates in general verification frameworks.

SUMMARY

The various embodiments disclosed herein address the above stated needs by providing systems, methods and computer products for improved redundancy removal to enhance the verification of designs with constraints.

Various embodiments involve determining redundancies in a system model with constraints which is a speculatively-reduced model. A candidate redundant gate is selected, and then a replicated constraint cone is added to the system model, the replicated constraint cone replicating a combinational fanin of the constraints. A merged model with said constraints is built but without the candidate redundant gate. Then an attempt is made to validate the candidate redundant gate using the speculatively reduced model.

Other embodiments involve a method for pre-determining redundant gates in a system model, for redundant gates that are suspected to be unsuitable for merging. A merged model is built having one or more desired merges, and then a composite model is built that includes a pre-merge model and the merged model. Primary inputs are connected together across both the pre-merge model and the merged model, and equivalence-checking gates are added to the inputs to check equivalence of a set of common signals to both the pre-merge model and the merged model. A verification is performed to assess the equivalence-checking gates over the set of common signals of the merged and unmerged models.

Yet other embodiments involve simplifying the verification of a pre-merge design with constraints. A set of candidate redundant gates is identified in the pre-merge design, and an arbitrary subset of the candidate redundant gates is merged to create a merged design. Then a verification on the merged design is performed.

BRIEF DESCRIPTION OF THE DRAWINGS

The accompanying drawings, which are incorporated in and constitute part of the specification, illustrate various embodiments of the invention. Together with the general description, the drawings serve to explain the principles of the invention. In the drawings.

DETAILED DESCRIPTION

Figure 1:
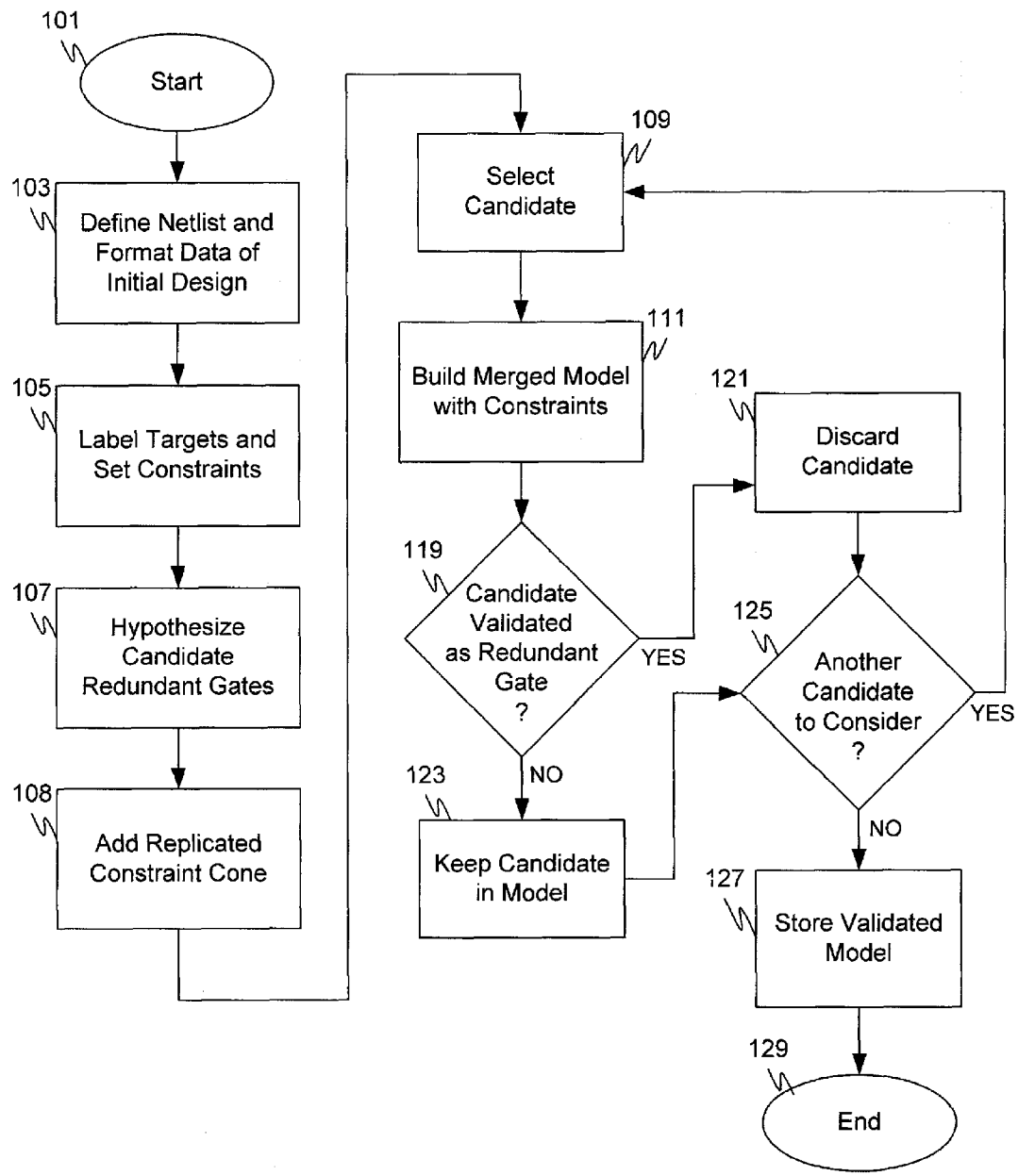
FIG. 1 depicts the flowchart of an exemplary method for identifying redundant gates in the model of a system such as a circuit diagram.

FIG. 1 depicts a flowchart 100 of an exemplary embodiment for a method of identifying redundant gates in the model of a system such as a circuit diagram. The method identifies redundant gates in the reachable states in the presence of constraints. Redundant gates are pairs of gates that evaluate to the same value in all reachable states in the presence of constraints. Constraints are gates which represent conditions that are not to be explored when analyzing the behavior of the design. For example, if performing functional verification on a design, the user of a verification tool may define constraints which are asserted if invalid instructions are issued onto the design inputs. The verification tool must then assess the behavior of the design only under scenarios that adhere to the constraints, in this case, under valid instructions. Constraints are increasingly prevalent mechanisms that can be used to prune reachable states in the development of verification testbenches. On the one hand, in reducing the set of reachable states of a netlist, constraints may enhance redundancy removal. On the other hand, merging gates in the cone of influence of a constraint may weaken the power of the constraint, thereby subjecting the verification framework to possible false-negatives, that is, reporting design errors which truly do not exist.

The method of FIG. 1 begins in 101 and proceeds to 103. One of the first tasks of the method 100 is to define the conventions and terms, set the initial conditions of the system model, and prepare the data in block 103. This often entails defining a netlist for the system design. An exemplary netlist contains a directed graph with vertices representing gates, and edges representing interconnections between those gates. The gates have associated functions, such as constants, primary inputs (which may be referred to as RANDOM gates), combinational logic such as AND gates, and sequential state holding elements. A sequential state holding element has one or more inputs and at least one output, each of which may be characterized by discrete states (e.g., logical 1 or logical 0). The various embodiments can be practiced with any sort of state machine including state holding elements (e.g., registers, latches, RAM circuitry, or the like). The state of the output (or the state of each output, if more than one) is determined by the previous states of the input channels. The initialization time or reset time of a register is referred to herein as time zero (t=0). Registers typically have two associated components, their next-state functions and their initial-value functions. Both of these associated components may be represented as other gates in the graph. Semantically, for a given register the value appearing at its initial-value gate at time logical 0 will be applied as the value of the register itself. The value appearing at its next-state function gate at time "i" will be applied to the register itself at time "i+1". Certain gates of the model may be labeled as targets.

Upon completing 103 the method proceeds to 105 to label the targets and set constraints. Targets correlate to the properties we wish to verify. One goal of the verification process is to find a way to drive a logical 1 to a target node, or to prove that no such assertion of the target is possible—that is, to verify whether or not the target node is reachable. If such a way is found, a counterexample trace illustrating this scenario may be generated to provide to the user. Constraints may be used to artificially limit the stimulus that can be applied to the design—that is, when searching for a way to drive a logical 1 to a target, the verification process must adhere to the rule that "every constraint node must evaluate to a logical 1 for every time-step." For example, a constraint could be added that drives a logical 1 exactly when a vector of RANDOM gates evaluates to even parity. Without this constraint, the verification tool would consider valuations with even or odd parity to those RANDOM gates. With the constraint, only even parity would be explored.

The method proceeds from 105 to 107 to hypothesize candidate redundant gates. The method can use any arbitrary set of mechanisms to guess gates suspected to be redundant. For example, one may use random simulation to explore the behavior of the design under a specific set of input stimuli, and group gates with identical behavior under those input valuations as candidate redundant gates. Once the candidate gates have been hypothesized or otherwise determined, and in some embodiments grouped together, the method proceeds to 108.

Block 108 replicates the logic in the combination fanin of the constraints. More specifically, it creates a copy of the logic driving each constraint gate, stopping at RANDOM gates and registers. It then re-labels the replicated counterpart of each constraint gate as the constraint. Regarding block 108, since the replicated cone has no fanout, it merely preserves the constraint behavior despite speculative reduction to ensure that the identified redundancy is accurate. Speculative reduction includes two aspects: (1) adding an equivalence check that the gates being merged are truly equivalent (sometimes referred to as a "miter"), and (2) replacing fanout references to the gate being merged with a reference to the gate it is being merged onto. The latter step is key to scalability, since it reduces the size of the verification problem by eliminating one gate. However, even if the gate being merged is in the combinational fanin of the constraint, it is still desirable to take advantage of the fanout reference moving (as per aspect (2)) since that simplifies the verification of the equivalence. Adding the replicated constraint cone in 108 preserves the constraint behavior, thus ensuring the identified redundancy to be accurate.

Upon completing 108 the method proceeds to 109 to select a candidate gate from each group of redundant gates. Said candidate must generally be selected from the original gates of the netlist, not from the replicated constraint cone, to ensure accuracy of the redundancy identification process. In some embodiment, more than one group of redundant gates, and more than one candidate, may be analyzed simultaneously. However, for the purposes illustration in this disclosure, the various embodiments are discussed in terms of handling one candidate—even though two or more candidates may be processed at once. Upon selecting a candidate gate in 109 the method proceeds to 111 to build a merged model. The merged model is built assuming the selected gate is redundant and can be eliminated while retaining equivalency with the pre-merge model. In conventional systems the speculative merged model is used to validate the selected candidate variable as being redundant in all cases. Sequential redundancy removal frameworks attempt to identify functionally redundant gates in a netlist, which may then be merged as a trace-equivalence-preserving transformation. A key to this approach is that the speculative merges preserve the ability to discern validity of the corresponding merges, thus identifying which merges are safe to perform. As such the speculative merge is relied upon as being key to the scalability of this algorithm. However, a problem arises in such use of merging in the cone of constraints, as follows. While this conventional scheme can properly identify which gates are redundant in all reachable states (which may be pruned due to the constraints), after merging (even speculative merging) within the fanin cone of the constraints, the function of the constraints may actually change. The fanin of a gate includes the gates that may concurrently affect the behavior of the gate, in other words, those gates that connect to the gate without passing through any registers. (A "fanin" cone may also be called a "fan in" cone, or "fan-in" cone.) While this change is only allowed to happen in states that are discarded by the constraints, when merging within the constraint cone, this risks weakening the constraint hence losing the ability that the simplified constraint cone still is able to eliminate the same set of states after the merge. To avoid this drawback, various embodiments of the present invention enumerate the merges that, if subsequently validated to preserve constraint strength or alternatively to preserve verification results, can be performed.

The drawbacks of conventional systems are overcome by using the assume-then-prove framework to perform speculative merging within the cone of constraints, then leveraging the constraining power of the constraints to prune the reachable states based on the fanin of the constraint. The fanin of a gate, which may or may not be a constraint gate, includes all the inputs and other gates in the support of the gate or constraint—that is, all inputs and other gates that may affect the behavior of the gate. This includes gates which may affect the gate several time-frames later, e.g., which must pass through registers before their connectivity to the gate. The combinational-fanin of a gate includes only those gates which may concurrently affect the behavior of the gate; e.g., which connect to the gate without passing through any registers. Doing this enhances reduction potential, with the following restrictions:

1) If the gate to be merged lies beyond at least one register boundary, the scheme may operate as normal. This is because the alteration of the design functionality will not affect constraint evaluation until at least one time-step later. A weakening of constraints will be trapped by some assertion firing before the constraint function can be changed.

2) If the gate to be merged is in the combinational fanin of the constraint, the various embodiments replicate the constraint cone, perform the speculative merge in the non-replicated constraint cone, and retain the replicated cone to define the constraint, thereby ensuring that merging in the constraint cone cannot alter the evaluation of the constraint until at least one time-step later. This replication is typically only done for the evaluation of the merge candidate enumeration, and will not be needed in subsequent analysis.

The merged model built in 111 assumes the candidate gate is redundant, thus eliminating that gate in the process of creating the merged model. Hence, the merged model is more streamlined, containing fewer gates than the pre-merged model (i.e., the model as it was before merging to remove the candidate variable). Once the merged model has been built the method then proceeds to 113. In block 113 it is determined whether the candidate gate to be merged is in the combinational fanin of the constraint. If the candidate is not within the merged constraint cone the method proceeds from 113 along the "NO" path to 117 to try to validate the candidate using the merged model. However, if it is determined in 113 that the candidate is within the merged constraint cone, the method then proceeds from 113 along the "YES" path to 117. In 117 the redundancy of the candidate is validity tested using the pre-merged model, the model before eliminating the variable presently under test for redundancy. Other embodiments involving validity testing of the candidate are disclosed below in conjunction with FIG. 2. Upon completing the validity testing for the candidate the method proceeds to 119.

In 119 the results of candidate validity testing are determined. If the candidate is validated as being a redundant gate the method proceeds from 119 along the "YES" path, keeping the merged model and discarding the candidate since it is redundant to the model. However, if it is determined in 119 that the redundancy hypothesis is not valid the method proceeds from 119 along the "NO" path to 123 and the candidate is kept, since it is not redundant. In this case the analysis reverts back to the pre-merged model, since the merged model (which assumed the candidate with redundant) is not valid. The method then proceeds to 125. In 125 it is determined whether there are further candidates of redundant gates, or combinations of candidates, to be evaluated. If there are more candidates left, the method proceeds along the "YES" branch from 125 back to 109 to select another candidate and start the process again. However, if it is determined that there are no further candidates for redundancy to be evaluated the method proceeds from 125 along the "NO" path to 127. In 127 the validated model is stored. If the candidate gate was determined to be redundant, the merged model is stored. Otherwise, the system retains the pre-merged model since the candidate turned out to not be redundant. The method then proceeds to 129 and ends.

Figure 2:
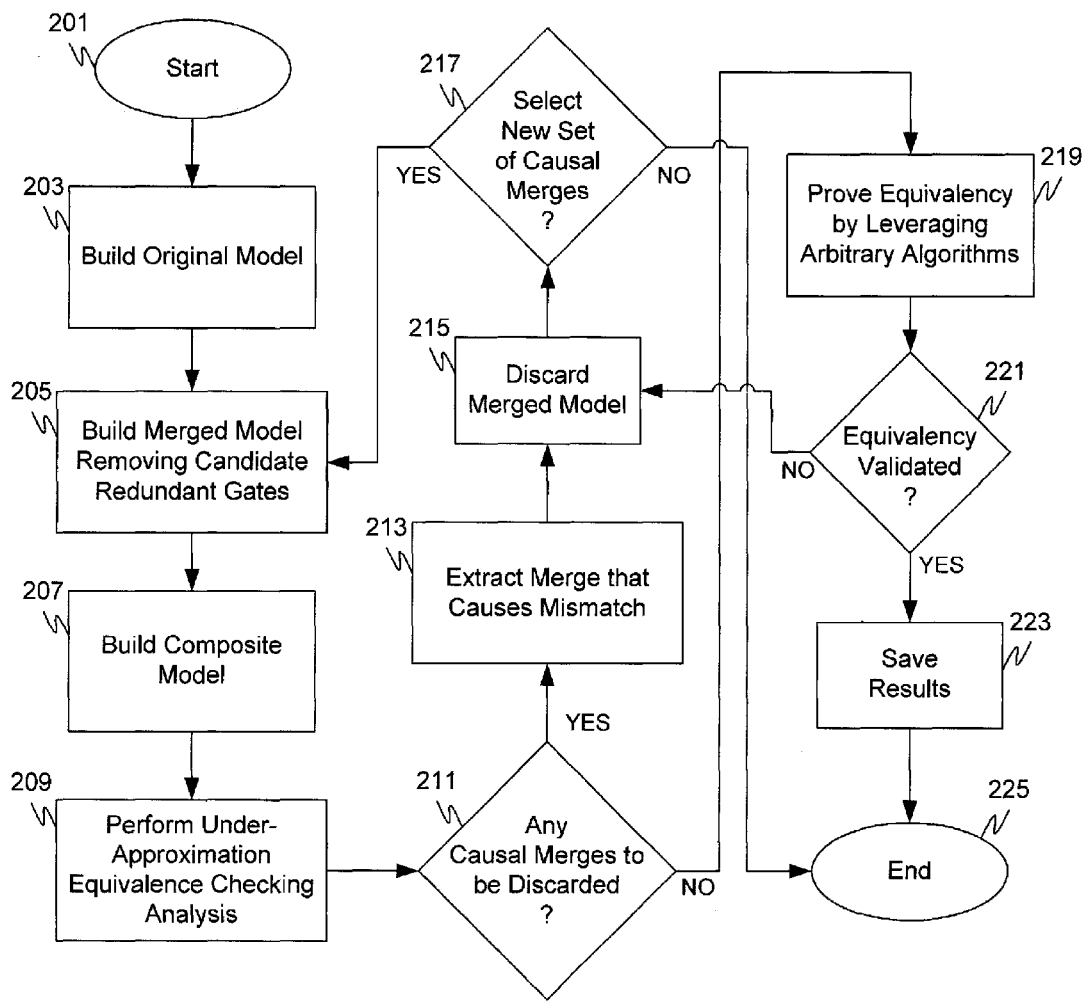
FIG. 2 depicts a flowchart of an exemplary method for efficiently analyzing which redundant gates may be merged without altering testbench and constraint semantics using falsification and proof analysis.

FIG. 2 depicts a flowchart 200 of an exemplary embodiment for a method to efficiently analyze which redundant gates may be merged without altering testbench and constraint semantics using falsification and proof analysis. A framework is disclosed that efficiently eliminates those merge candidates which can be demonstrated to weaken the constraints and alter the testbench semantics. Secondly, this embodiment provides a framework for proving the validity of the remaining candidates using a variety of proof techniques. Conventional systems produce merge candidates in which 1) either they reflect redundancy that holds in all reachable states regardless of the use of constraints to prune states, or 2) they reflect redundancy in all reachable states except those discarded by the constraints. The former set can safely be merged even using conventional systems. However, the latter set needs to be validated to discern whether or not it will alter the testbench semantics, before the merges can be performed. Conventional systems disallow such merges to avoid invalid behavior of the resulting merged model. In contrast the current invention attempts to discern which of such discarded merges may be safely merged, enabling significantly greater reduction potential than possible using conventional systems. The exemplary embodiment depicted in FIG. 2 aids in addressing this concern.

This framework of this embodiment operates on a model which includes two copies of the original design. In one model the merges are not performed, and in the other one they are performed. A proof obligation is added across these two models to discern whether they alter testbench semantics. This proof obligation may be implemented in different formats. In a first example, the proof can check equivalence of all gates used to represent the constraints in both models. In another example, the proof can check the equivalence of all verification goals (e.g., targets) in both models while tracking whether constraint semantics were violated.

Generally, the likelihood of erroneously identifying a redundant gate increase as more constraints are retained in an equivalence checking problem, since constraints in one model prune the exploration of states in the composite model. In our case, we cannot retain the constraints of the unmerged design in the composite model, since those have the exact constraining power of the original design. This would prevent our equivalence check from assessing if the merges weaken the constraints. However, we may retain the constraints in the merged model, since the only impact of these particular merges is to potentially weaken constraints. Moreover, retaining constraints in the merged model has the beneficial effect of enabling a significant reduction in verification complexity. Once constructed, the various embodiments may use a fast underapproximation analysis to identify invalid merge candidates. Then the system may proceed with attempting to prove that the remaining merges do not alter verification semantics.

Turning to FIG. 2, the method begins in 201 and proceeds to 203 to build an original model of the system being analyzed. (This original model may also be called a "pre-merge" model to distinguish it from the "merged" model.) The activities in block 203 may include defining a netlist and labeling the targets/constraints, similar to those activities discussed above in 103-105 of FIG. 1. The method then proceeds to 205 to build a merged model. In doing this a candidate redundant gate is identified, and then removed from the model (since it is hypothesized to be redundant). The merged model may include constraints, but the pre-merged model typically does not include such constraints. The pre-merged model may be associated with the merged model, calling the combination of the two a composite model. The method then proceeds to 207 to build equivalence checks within the composite model, checking for the equivalence of various gates across the pre-merged model and the newly built merged model. The equivalency of the models may be checked in a number of ways. For instance, the test may involve checking the equivalence of all gates used to represent the constraints in both models. In another embodiment, the equivalency test may entail checking the equivalence of all verification goals (e.g., targets) in both models while tracking whether constraint semantics have been violated. This may be done by creating a gate in each model which initializes to logical 1, but then becomes logical 0, and remains 0, in response to any of the constraint gates being violated. This newly created gate can be ANDed with each original target, with the result of the AND function being the signal to be checked for equivalence across the two models. The latter example of equivalence checking often results in a greater degree of merging since a mismatch across both models occurs only if the constraints can be violated in a way which alters evaluation of the targets. The improved results, however, come at a cost since the latter equivalence check tends to be a more difficult equivalence proof because more gates are included. Upon completing the equivalence check in 207 the method proceeds to 209.

In 209 an underapproximate analysis is performed to quickly identify a subset of merges which will weaken constraint semantics. Examples of underapproximate techniques which may be used for this purpose include bounded exhaustive search using formal verification algorithms such as satisfiability solvers or Binary Decision Diagrams (BDD) to assess the behavior of the composite model for an initial number of time-frames, and random simulation which assesses the behavior of the design against specific input patterns. The assessment of merges which weaken constraints may be performed by enumerating those merges which are witnessed to evaluate to different values across both models in the mismatching analysis (typically reported as a trace). Optional subsetting techniques may be used to reduce this set. The resulting merge set may be discarded, rebuilding the composite model without those identified merges. Once the underapproximation equivalence checking analysis is completed the method proceeds from 209 to 211 to act on the results of the underapproximation equivalence checking analysis and determine whether any mismatches due to the underapproximations are observed. If it is determined in 211 that there is a mismatch (or multiple mismatches) the method proceeds from 211 along the "YES" path to 213 to extract any observed causal merges that can weaken the constraints. Once the merge that caused the mismatch is extracted in 213 the method proceeds to 215 to discard the merged model. The method then proceeds from 215 to 217 where it is determined whether a new set of causal merges is to be selected to test another candidate redundant gate. If no further candidates are to be tested the method proceeds from 217 along the "NO" branch to 225 and ends. However, if another merged model is to be built testing using a subset of merges (which eliminate the causal merges) the method proceeds from 217 along the "YES" path back to 205 to build another merged model. If a mismatch was detected in 209/211 the system may identify a new set of causal merges in 205 and rebuild the composite model without the mismatches.

Returning to block 211, in the event it is determined in 211 that no mismatches have been observed the method proceeds from 211 along the "NO" path to 219. In 219 equivalency may be further tested by leveraging an arbitrary set of algorithms to prove that the equivalence checks in the composite model are valid—that is, test whether or not the merges have altered the semantics of the two models. Unlike the underapproximate equivalence checking algorithms used in 209, which only partially validate the behavior of the design, 219 uses an alternate set of algorithms which exhaustively check the behavior of the design. The method then proceeds to 221. If the equivalence is invalidated the method proceeds from 221 along the "NO" branch back to 215 to discard the merged model and determined causal merges, and start the process over (or end the process via the "NO" branch of 217). However, if it is determined in 221 that the equivalency is valid the method proceeds from 221 along the "YES" path to 223. In 223 the results are saved indicating which merges have been retained through the iterations which discard causal merges due to inequivalency. Typically, the final results as well as interim results at various stages are saved in a machine readable format on a computer disk, computer memory, or some other like type of storage means. The method then proceeds to 225 and ends.

Figure 3:
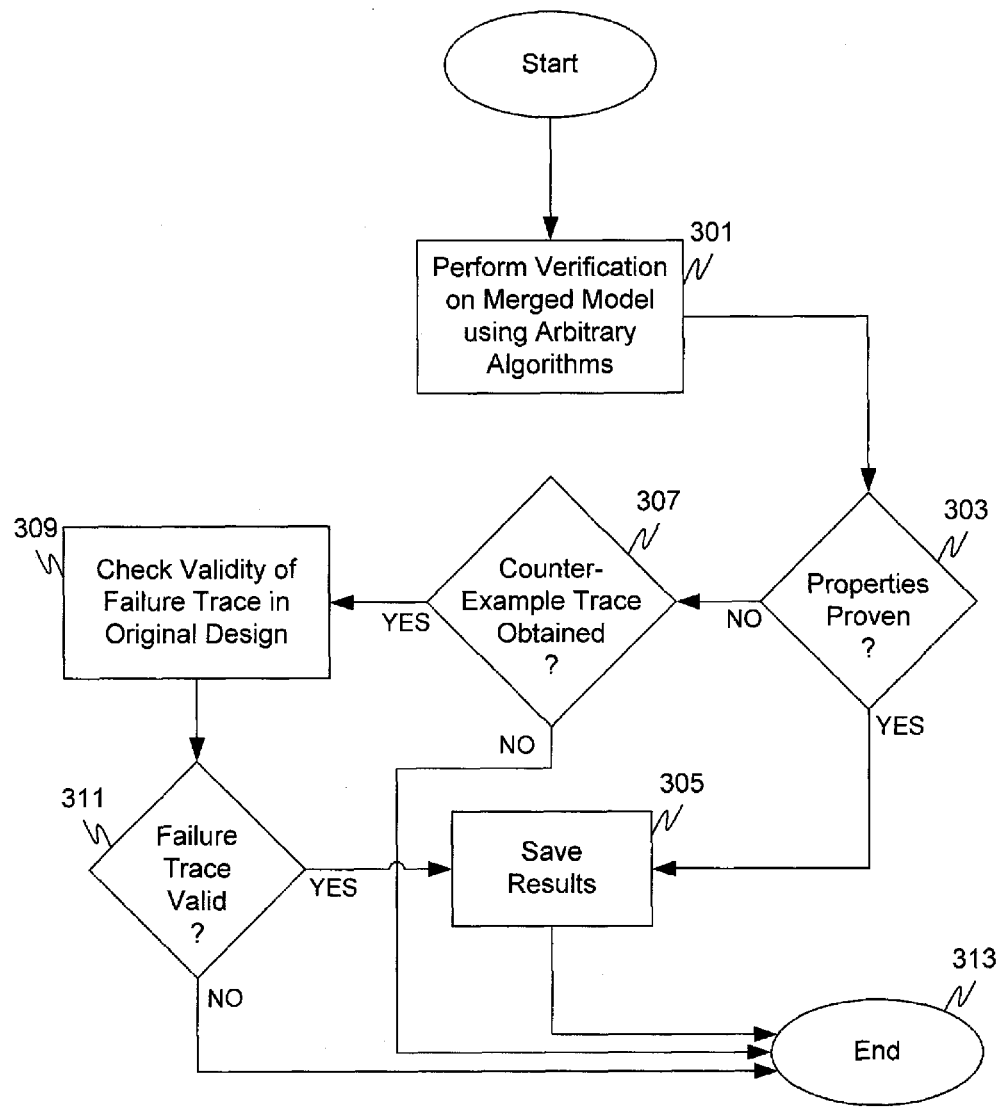
FIG. 3 depicts a flowchart of an exemplary method for efficiently validating the equivalence by leveraging arbitrary algorithms.

FIG. 3 depicts a flowchart 300 of a method for efficiently validating the equivalency by leveraging arbitrary algorithms. The activities of block 219 of FIG. 2 for validating the equivalency by leveraging arbitrary algorithms can be fairly expensive, often requiring a great deal of computational effort. However, the present inventors noted that a merge in the constraint cone does not weaken the constraint. Taking advantage of that, the embodiment of FIG. 3 involves a scheme that allows for the merge candidates remaining after falsification checking (e.g., after 209/211 of FIG. 2) to be leveraged, thus simplifying the testbench analysis without requiring the overhead of completing this proof. The method of FIG. 3 may be performed in lieu of the activities in blocks 219-225 of FIG. 2, for example, following the "NO" branch of 211 of FIG. 2.

Regarding the activities of the FIG. 3 method, the present inventors noted that because these merges can only weaken a constraint cone, this implies that the only symptom of performing the merging without validating that the merges do not violate testbench semantics is that spurious fails may occur. For example, a property that truly passes may instead fail, rendering a trace which does not adhere to the constraint semantics. Given this, the verification on the model may be performed without first validating the merges. If a proof is obtained that the design satisfies its properties with these merges, that result will be valid for the original design. Otherwise, upon obtaining a failure trace, there is a need to validate that failure trace for the original design, in particular, that it preserves constraint semantics. If not, that result should be suppressed from the user of the verification tool. If the failure trace cannot be validated (and indeed indicates a failure) a set of invalid merges can be derived from that trace and used to undo the associated merges, similar to block 213 of FIG. 2. The overall solution of this embodiment may be implemented as follows in the flowchart of FIG. 3.

The method of FIG. 3 begins at 301 and proceeds to 303 to test the equivalency of the models by leveraging arbitrary algorithms. The method then proceeds to 305 to determine whether the properties of the design have been proven correct. If it is determined in 305 that the properties have been proven correct of the merged design, the method proceeds from 305 along the "YES" path to 307 to save the results. The method then proceeds to 315 and ends. However, back in 305 if the equivalency proof fails the method proceeds from 305 along the "NO" path to 309. In 309 it is determined whether a counter example trace has been obtained, indicating a failure of the properties on the merged design. If no counter example trace has been obtained, indicating that the properties are unsolved (i.e., not determined to have been proven correct nor incorrect), the method proceeds from 309 along the "NO" path to 315 and ends. (In some embodiments the method may proceeds from 309 along the "NO" path to 215 of FIG. 2 to eliminate any desired merges and attempt verification anew on a new merged model.) Returning to FIG. 3, if it is determined in 309 that a counterexample trace has been obtained the method proceeds from 309 along the "YES" path to 311.

In block 311 the validity of the failure trace is checked in the original design to determine whether the failure trace is actually valid for the original design—that the failure trace preserves the constraint semantics. This may be done by simulating the failure trace on the original design to assess whether it is valid. The method then proceeds to 313 for the results of checking the validity of the failure trace in the original design. If the failure trace is determined to be valid—that is, if the counterexample obtained on the merged design represents a valid property failure on the original design—the method proceeds from 313 along the "YES" path to save the results in 307. Upon completing 307 the method proceeds to 315 and ends. However, if it is determined in 313 that the failure trace is invalid (and the candidate is not redundant) the method proceeds from 313 along the "NO" path to 315 and ends. In some embodiments the method may proceeds from 313 along the "NO" path to 213 of FIG. 2 to extract the merge that caused the spurious failure and begin the verification process anew on a new merged model.

Figure 4:
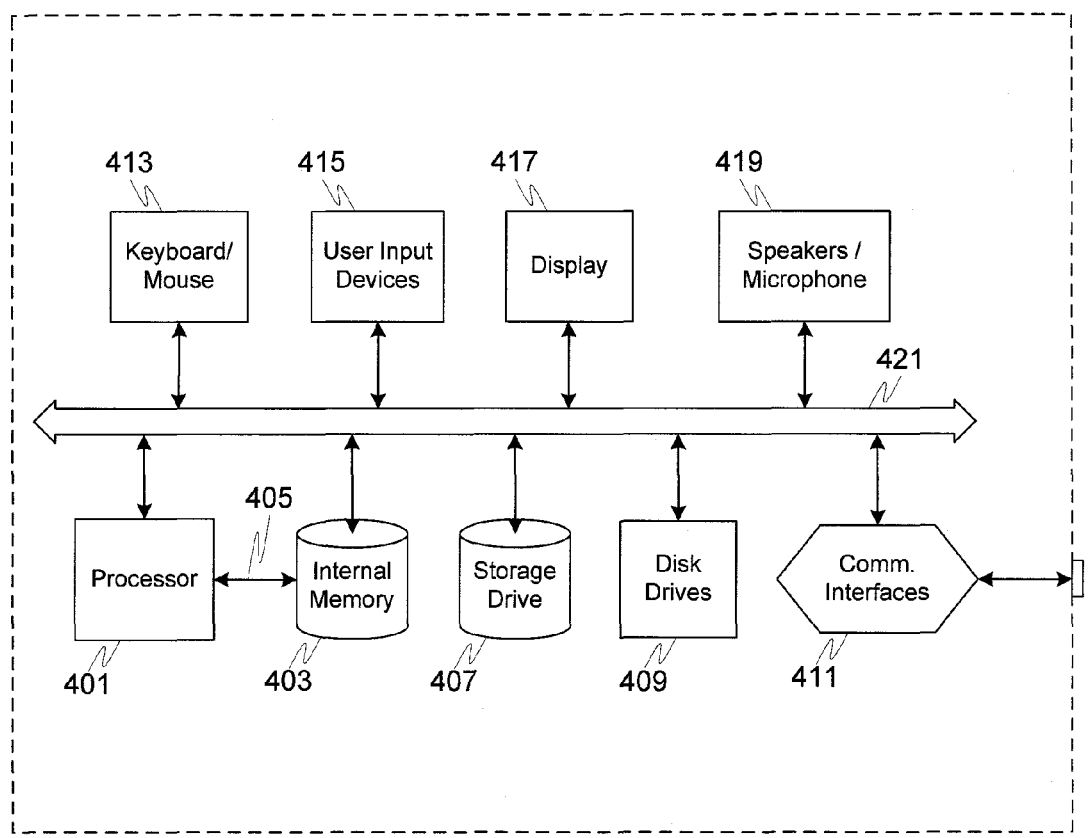
FIG. 4 depicts an exemplary computer system 400 suitable for implementing and practicing various exemplary embodiments.

FIG. 4 depicts an exemplary computer system 400 suitable for implementing and practicing various exemplary embodiments. The computer system 400 may be configured in the form of a desktop computer, a laptop computer, a mainframe computer, or any other arrangements capable of being programmed or configured to carry out instructions. The computer system 400 may be located and interconnected in one location, or may be distributed in various locations and interconnected via a local or wide area network (LAN or WAN), via the Internet, via the public switched telephone network (PSYN), or other such communication links. Other devices may also be suitable for implementing or practicing the embodiments, or a portion of the embodiments. Such devices include personal digital assistants (PDA), wireless handsets (e.g., a cellular telephone or pager), and other such consumer electronic devices preferably capable of being programmed to carry out instructions or routines.

Typically, a computer system 400 includes a processor 401 which may be embodied as a microprocessor or central processing unit (CPU). The processor 401 is typically configured to access an internal memory 403 via a bus such as the system bus 421. The internal memory 403 may include one or more of random access memory (RAM), read-only memory (ROM), cache memory, or a combination of these or other like types of circuitry configured to store information in a retrievable format. In some implementations the internal memory 403 may be configured as part of the processor 401, or alternatively, may be configured separate from it but within the same packaging. The processor 611 may be able to access internal memory 403 via a different bus or control lines (e.g., local bus 405) than is used to access the other components of computer system 400.

The computer system 400 also typically includes, or has access to, one or more storage drives 407 (or other types of storage memory) and floppy disk drives 409. Storage drives 407 and the floppy disks for floppy disk drives 409 are examples of machine readable mediums suitable for storing the final or interim results of the various embodiments. The storage drive 407 is often a hard disk drive configured for the storage and retrieval of data, computer programs or other information. The storage drive 407 need not necessary be contained within the computer system 400. For example, in some embodiments the storage drive 407 may be server storage space within a network or the Internet that is accessible to the computer system 400 for the storage and retrieval of data, computer programs or other information. For example, the computer system 400 may use storage space at a server storage farm accessible by the Internet 450 or other communications lines. The floppy disk drives 409 may include a combination of several disc drives of various formats that can read and/or write to removable storage media (e.g., CD-R, CD-RW, DVD, DVD-R, floppy disk, etc.). The computer system 400 may either include the storage drives 407 and floppy disk drives 409 as part of its architecture (e.g., within the same cabinet or enclosure and/or using the same power supply), as connected peripherals, or may access the storage drives 407 and floppy disk drives 409 over a network, or a combination of these. The storage drive 407 is often used to store the software, instructions and programs executed by the computer system 400, including for example, all or parts of the computer application program for project management task prioritization.

The computer system 400 may include communication interfaces 411 configured to be communicatively connected to the Internet, a local area network (LAN), a wide area network (WAN), or connect with other devices using protocols such as the Universal Serial Bus (USB), the High Performance Serial Bus IEEE-1394 and/or the high speed serial port (RS-232). The computers system 400 may be connected to the Internet via the wireless router 401 (or a wired router or other node—not show) rather than have a direct connected to the Internet. The components of computer system 400 may be interconnected by a bus 421 and/or may include expansion slots conforming to any of various industry standards such as PCI (Peripheral Component Interconnect), ISA (Industry Standard Architecture), or EISA (enhanced ISA).

Typically, the computer system 400 includes one or more user input/output devices such as a keyboard and/or mouse 413, or other means of controlling the cursor (e.g., touchscreen, touchpad, joystick, trackball, etc.) represented by the user input devices 415. A display 417 is also generally included as part of the computer system 400. The display may be any of several types of displays, including a liquid crystal display (LCD), a cathode ray tube (CRT) monitor, a thin film transistor (TFT) array, or other type of display suitable for displaying information for the user. The display 417 may include one or more light emitting diode (LED) indicator lights, or other such display devices. In addition, most computer systems 400 also include, or are connected to, one or more speakers and microphones 419 for audio output and input. Speech recognition software may be used in conjunction with the microphones 419 to receive and interpret user speech commands.

The invention may be implemented with any sort of processing units, processors and controllers capable of performing the stated functions and activities. For example, the processor 401 (or other processors used to implement the embodiments) may be a microprocessor, microcontroller, DSP, RISC processor, or any other type of processor that one of ordinary skill would recognize as being capable of performing the functions or activities described herein. A processing unit in accordance with at least one exemplary embodiment can operate computer software programs stored (embodied) on a computer-readable medium such as the internal memory 403, the storage drive 407, or other type of machine-readable medium, including for example, floppy disks, optical disks, a hard disk, CD, flash memory, ram, or other type of machine readable medium as recognized by those of ordinary skill in the art.

State holding elements, or state elements, are discussed above in terms of being implemented as registers or gates. However, in some embodiments any sort of state holding element may be used to implement various embodiments, including for example, registers, latches, state machines, or the like. For the purposes of illustrating and explaining the invention the terms variable, gate and register have been used interchangeably throughout this disclosure.

Regarding the flowcharts depicted in FIGS. 1-3, various method activities may be included or excluded as described above, or performed in a different order than shown in the figures, and still remain within the scope of at least one exemplary embodiment. For example, in some implementations of the FIG. 2 method the system may proceed from 221 via the "YES" branch to 217 (instead of going from 221 to 223) to determine whether there are more candidates to evaluate rather than saving the results in 223. It is understood that the scope of the present invention encompasses other such omissions, additions, or changes to the flow charts and figures.

The computer software products or application programs can aid in the performance of, or perform, the various steps and activities described above. For example computer programs in accordance with at least one exemplary embodiment may include source code for selecting a candidate redundant gate; source code for building a merged model with constraints, said merged model being built without the candidate redundant gate, wherein said system model is a pre-merge model; source code for determining whether said candidate redundant gate is within a merged constraint cone of said merged model; and attempting to validate said candidate redundant gate using the pre-merge model if said candidate redundant gate is determined to be within the merged constraint cone; as well as source code for any other activities performed in an implementation of the various embodiments. For example, there are many further source codes that may be written to perform the stated steps and procedures above, and these are intended to lie within the scope of exemplary embodiments.

The use of the word "exemplary" in this disclosure is intended to mean that the embodiment or element so described serves as an example, instance, or illustration, and is not necessarily to be construed as preferred or advantageous over other embodiments or elements. The description of the various exemplary embodiments provided above is illustrative in nature and is not intended to limit the invention, its application, or uses. Thus, variations that do not depart from the gist of the invention are intended to be within the scope of the embodiments of the present invention. Such variations are not to be regarded as a departure from the spirit and scope of the present invention.

The description of the various exemplary embodiments provided above is illustrative in nature and is not intended to limit the invention, its application, or uses. Thus, variations that do not depart from the gist of the invention are intended to be within the scope of the embodiments of the present invention. Such variations are not to be regarded as a departure from the spirit and scope of the present invention.

What is claimed is:

1. A method executed on a computer for simplifying verification of a circuit design represented by a model with constraints, said circuit design being a pre-merge design, the method comprising:
    identifying a set of candidate redundant gates in the pre-merge design;
    merging an arbitrary subset of the candidate redundant gates to create a merged design;
    performing a verification process on the merged design; and
    storing an output of the verification process in a machine readable medium accessible by said computer;
    in response to determining that a property of the merged design is incorrect and identifying a failure scenario with said property, attempting to map the failure scenario on the merged design to a corresponding failure scenario on the pre-merge design; and
    in response to successfully mapping the failure scenario of the merged design to a corresponding failure scenario on the pre-merge design, reporting that a corresponding property of the pre-merge design.

2. The method of claim 1, further comprising:
    in response to determining that a property of the merged design is correct, reporting that a corresponding property is correct for the pre-merge design.

3. The method of claim 1, further comprising:
    in response to an inability to successfully map the failure scenario of the merged design to a corresponding failure scenario on the pre-merge design, refining the merged model by eliminating a subset of causal merges.

4. The method of claim 1, further comprising:
    adding a replicated constraint cone, wherein the replicated constraint cone replicates a combinational fanin of the constraints.

5. The method of claim 1, further comprising:
    building a composite model including the pre-merge design and the merged design.

6. The method of claim 5, further comprising:
    adding equivalence-checking gates to inputs to check equivalence of a set of common signals to both the pre-merge model and the merged model;
    wherein said verification process assesses the equivalence-checking gates over a set of signals common to the pre-merge design and the merged design.

7. A software product comprising a machine readable medium including a program of instructions for simplifying verification of a pre-merge design with constraints, wherein the program of instructions upon being executed on a computer causes the computer to perform activities comprising:
    identifying a set of candidate redundant gates in the pre-merge design;
    merging an arbitrary subset of the candidate redundant gates to create a merged design;
    performing a verification process on the merged design; and
    storing an output of the verification process in a machine readable medium accessible by said computer;
    in response to determining that a property of the merged design is incorrect and identifying a failure scenario with said property, attempting to map the failure scenario on the merged design to a corresponding failure scenario on the pre-merge design; and
    in response to successfully mapping the failure scenario of the merged design to a corresponding failure scenario on the pre-merge design, reporting that a corresponding property of the pre-merge design.

8. The software product of claim 7, further comprising:
    in response to determining that a property of the merged design is correct, reporting that a corresponding property is correct for the pre-merge design.

9. The software product of claim 7, further comprising:
    in response to an inability to successfully map the failure scenario of the merged design to a corresponding failure scenario on the pre-merge design, refining the merged model by eliminating a subset of causal merges.

10. The software product of claim 7, further comprising:
    adding a replicated constraint cone, wherein the replicated constraint cone replicates a combinational fanin of the constraints.

11. The software product of claim 10, further comprising:
building a composite model including the pre-merge design and the merged design.

12. The software product of claim 11, further comprising:
adding equivalence-checking gates to inputs to check equivalence of a set of common signals to both the pre-merge model and the merged model;
wherein said verification process assesses the equivalence-checking gates over a set of signals common to the pre-merge design and the merged design.

* * * * *